US011249499B2

(12) United States Patent
Kurylak et al.

(10) Patent No.: US 11,249,499 B2
(45) Date of Patent: Feb. 15, 2022

(54) LINEAR TRANSIMPEDANCE AMPLIFIER DUAL REGULATOR ARCHITECTURE AND TUNING (71) Applicant: Cisco Technology, Inc., San Jose, CA (US)

(72) Inventors: Alexander Kurylak, Nazareth, PA (US); Bibhu Prasad Das, Allentown, PA (US); Kadaba Lakshmikumar, Basking Ridge, NJ (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 78 days.

(21) Appl. No.: 16/808,926

(22) Filed: Mar. 4, 2020

(65) Prior Publication Data
US 2021/0278869 A1 Sep. 9, 2021

(51) Int. Cl.
H03F 3/50 (2006.01)
H03F 3/08 (2006.01)
G05F 1/575 (2006.01)
H03F 1/02 (2006.01)

(52) U.S. Cl.
CPC ............ *G05F 1/575* (2013.01); *H03F 1/0211* (2013.01); *H03F 3/50* (2013.01)

(58) Field of Classification Search
CPC .......... G05F 1/575; H03F 1/0211; H03F 3/50; H03F 1/08; H03F 3/08
USPC ................................ 330/307–308, 297, 310
See application file for complete search history.

(56) References Cited

U.S. PATENT DOCUMENTS

| 5,532,471 A | 7/1996 | Khorramabadi et al. |
| 5,714,909 A | 2/1998 | Jackson |
| 6,037,841 A | 3/2000 | Tanji et al. |
| 6,084,478 A | 7/2000 | Mayampurath |
| 6,140,878 A | 10/2000 | Masuta |
| 6,404,281 B1 | 6/2002 | Kobayashi |
| 6,538,245 B1 | 3/2003 | Kozlowski |
| 6,720,826 B2 | 4/2004 | Yoon |
| 6,720,830 B2 | 4/2004 | Andreou et al. |
| 6,737,924 B1 | 5/2004 | Paillet et al. |

(Continued)

FOREIGN PATENT DOCUMENTS

| WO | 00/31867 | 6/2000 |
| WO | 2016007370 A1 | 1/2016 |

OTHER PUBLICATIONS

Kangyeob Park et al., "A 40-Gb/s 310-fJ/b Inverter-Based CMOS Optical Receiver Front-End", IEEE Photonics Technology Letters, vol. 27, No. 18, Sep. 15, 2015, 4 pages.

(Continued)

*Primary Examiner* — Hieu P Nguyen
(74) *Attorney, Agent, or Firm* — Edell, Shapiro & Finnan, LLC (57) ABSTRACT A system includes a transimpedance amplifier, disposed on a chip, having a front-end section and a back-end section; an on-chip linear regulator, on the chip, arranged to power the front-end section; and an off-chip switching regulator, off the chip, arranged to power the back-end section. The arrangement provides low noise power supply for the front-end section, while providing a more power efficient switching regulator to power the back-end section. The output voltage of the on-chip linear regulator and the output voltage of the off-chip switching regulator are controlled to be the same.

20 Claims, 9 Drawing Sheets

(56) References Cited

U.S. PATENT DOCUMENTS

| | | | |
|---|---|---|---|
| 6,771,132 | B1 | 8/2004 | Denoyer et al. |
| 6,778,021 | B2 | 8/2004 | Denoyer et al. |
| 7,205,845 | B2 | 4/2007 | Harms et al. |
| 7,236,056 | B2 | 6/2007 | Chang et al. |
| 7,562,581 | B2 | 7/2009 | Garverick et al. |
| 7,605,660 | B1 | 10/2009 | Kobayashi |
| 8,445,832 | B2 | 5/2013 | Takemoto et al. |
| 8,729,452 | B2 | 5/2014 | Tatsumi |
| 8,970,300 | B2 | 3/2015 | Piepenstock et al. |
| 9,325,557 | B2 | 4/2016 | Hayashi et al. |
| 9,762,186 | B2 | 9/2017 | Kim |
| 9,819,422 | B2 | 11/2017 | Guckenberger |
| 11,005,573 | B2 * | 5/2021 | Papanikolaou ... H04L 25/03885 |
| 2002/0067838 | A1 | 6/2002 | Kindred et al. |
| 2002/0089728 | A1 | 7/2002 | Kim |
| 2005/0218299 | A1 | 10/2005 | Olsen et al. |
| 2007/0139118 | A1 | 6/2007 | Teo et al. |
| 2015/0071654 | A1 | 3/2015 | Morita |
| 2019/0131945 | A1 | 5/2019 | Lakshmikumar et al. |

OTHER PUBLICATIONS

Dan Li et al., "Stacked Multi-Channel Receiver Architecture for Power-Efficient High-Speed Optical Links", IEEE Photonics Technology Letters, vol. 31, No. 7, Apr. 1, 2019, 4 pages.

Clint L. Schow et al., "A 24-Channel, 300 Gb/s, 8.2 pJ/bit, Full-Duplex Fiber-Coupled Optical Transceiver Module Based on a Single "Holey" CMOS IC", Journal of Lightwave Technology, vol. 29, No. 4, Feb. 15, 2011, 12 pages.

International Search Report and Written Opinion in counterpart International Application No. PCT/US2021/019595, dated Jun. 11, 2021, 16 pages.

A. Cevrero, et al., "A 64Gb/s 1.4pJ/b NRZ Optical-Receiver Data-Path in 14nm CMOS FinFET", ISSCC 2017 / Session 29 / Optical- And electrical-Link Innovations / 29.1, 2017 IEEE International Solid-State Circuits Conference, Feb. 8, 2017, 3 pages.

A. Awny, et al., "A Dual 64Gbaud 10kΩ 5% THD Linear Differential Transimpedance Amplifier with Automatic Gain Control in 13 µm BiCMOS Technology for Optical Fiber Coherent Receivers", ISSCC 2016 / Session 23 / Electrical and Optical Link Innovations / 23.5, 2016 IEEE International Solid-State Circuits Conference, Feb. 3, 2016, 3 pages.

G. Kalogerakis, et al., "A Quad 25Gb/s 270mW TIA in 0.13µ BiCMOS with <0.15dB Crosstalk Penalty", ISSCC 2013 / Session 7 / Optical Transceivers and Silicon Photonics / 7.1, 2013 IEEE International Solid-State Circuits Conference, Feb. 19, 2013, 3 pages.

D. Ferenci, et al., "A Highly Linear Transimpedance Amplifier in InP Technology for Application in 100 Gbit/s Fiber Optical Data Communication", Proceedings of the 8th European Microwave Integrated Circuits Conference, Oct. 6-8, 2013, Nuremberg, Germany, 4 pages.

Invitation to Pay Additional Fees and Partial International Search Report in counterpart International Application No. PCT/US2018/057633, dated Feb. 7, 2019, 16 pages.

International Search Report and Written opinion in counterpart International Application No. PCT/US2018/057633, dated Apr. 2, 2019, 19 pages.

* cited by examiner

LINEAR TRANSIMPEDANCE AMPLIFIER DUAL REGULATOR ARCHITECTURE AND TUNING

TECHNICAL FIELD

The present disclosure relates to approaches to powering an integrated circuit, such as a transimpedance amplifier.

BACKGROUND

Optical links are replacing electrical interconnects in data center infrastructure. Optical links support much higher data rates compared to electrical ones. Optical links also consume a fraction of the power of conventional electrical links. The latest push is to transport at least 100 Gbps on a single wavelength of light. At such rates, the bandwidth of the popular binary NRZ (non-return-to-zero) signaling scheme is too large to be supported by the electrical-to-optical and optical-to-electrical interfaces. Advanced modulation techniques are useful to reduce the bandwidth. One such technique is pulse-amplitude-modulation with four levels (PAM-4). Two bits are encoded into one of four levels. As a result, the symbol rate (baud rate) will be half of the bit rate and the bandwidth requirement is reduced compared to NRZ signaling. One aspect of this approach is, however, that the signal processing circuits have to be linear. This is a challenge in low-voltage complementary metal-oxide-semiconductor (CMOS) processes. A fine-linewidth CMOS process offers very high-speed transistors, but the operating voltage is typically 1 V or less. In order to preserve clearly discernable and equally spaced four levels, the signal processing circuits should exhibit high-linearity and low-noise.

A transimpedance amplifier (TIA) is an element used in converting optical signals to electrical signals. High-bandwidth linear TIAs are often realized in Indium Phosphide (InP) or Silicon Germanium (SiGe) BiCMOS (Bi-complementary metal-oxide-semiconductor) technologies, where the bipolar transistors offer high speed, low noise, and sustain high voltages. However, the signal processing and logic requirement of a monolithic transceiver integrated circuit (IC) are best realized in CMOS technology. A linear TIA designed in a fine-line CMOS process is likely to face the major technological challenges of signal compression due to limited supply voltage. Moreover, in high speed optical links, the TIA may contribute substantially to overall chip power consumption.

DESCRIPTION OF EXAMPLE EMBODIMENTS

Overview

In one embodiment, a system includes a transimpedance amplifier, disposed on a chip, having a front-end section and a back-end section; an on-chip linear regulator, on the chip, arranged to power the front-end section; and an off-chip switching regulator, off the chip, arranged to power the back-end section. The arrangement provides a low noise power supply for the front-end section, while providing a more power efficient switching regulator to power the back-end section. The output voltage of the on-chip linear regulator and the output voltage of the off-chip switching regulator are controlled to be the same.

In another embodiment a method is provided. The method includes receiving power at a front-end section of a transimpedance amplifier, disposed on a chip, from an on-chip linear regulator disposed on the chip; receiving power at a back-end section of the transimpedance amplifier, from an off-chip switching regulator; monitoring an output voltage of the on-chip linear regulator and an output voltage of the off-chip switching regulator; and causing the output voltage of the off-chip switching regulator to be the same as the output voltage of the on-chip linear regulator.

EXAMPLE EMBODIMENTS

There are several challenges in building a high-speed linear transimpedance amplifier (TIA) in a low-voltage CMOS process. One consideration is the low signal swing imposed by the low supply voltage that can be used. As the signal swing increases, the distortion increases rapidly. Negative feedback cannot be used to improve the linearity because the loop-gain will be very low at the frequencies of interest (~30 GHz). Added to this conundrum is the wide dynamic range of the input. At low input levels, the signal-to-noise ratio (SNR) is limited by the noise generated by the TIA. Even after achieving a low input-referred noise, the TIA output should be large enough to overcome the quantization noise of the following A/D converter that is in the link. A large swing in a low-voltage technology using conventional techniques would be very non-linear. When the input signal is large, the non-linearity becomes worse. Therefore, a low-noise, wide dynamic range, high gain-bandwidth, linear TIA is quite useful. A TIA that is optimized for power consumption is likewise quite useful.

Figure 1:
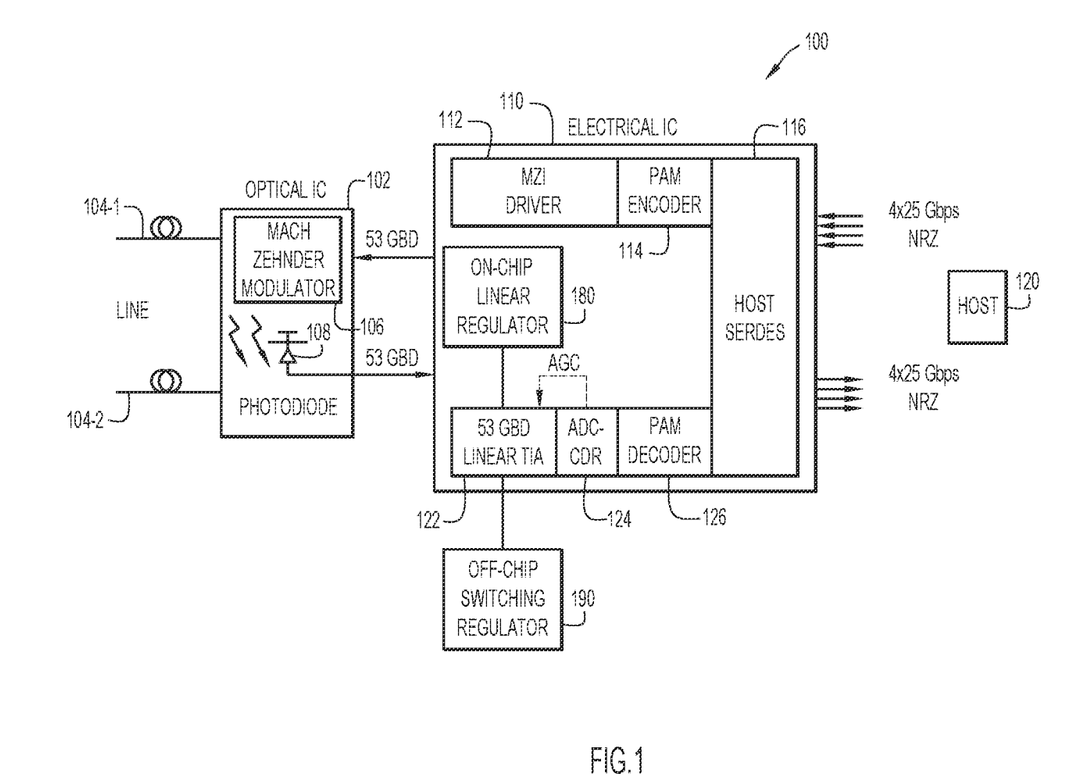
FIG. 1 is a block diagram depicting an optical transceiver that includes a transimpedance amplifier that is powered by an on-chip linear regulator and an off-chip switching regulator, according to an example embodiment.

FIG. 1 is a block diagram depicting an optical transceiver that includes a transimpedance amplifier that is powered by an on-chip linear regulator and an off-chip switching regulator, according to an example embodiment. An optical transceiver is only one example of the use of a linear TIA according to the embodiments presented herein. The optical transceiver 100 includes an optical integrated circuit (IC) 102 coupled to one or more optical fibers (lines). The optical lines shown in FIG. 1 include an output line 104-1 configured to forward optical signals from the optical IC 102 and an input line 104-2 configured to forward optical signals to the optical IC 102. The optical IC 102 includes an electro-optic modulator 106 and a photodiode 108. In one embodiment, the electro-optic modulator 106 may be a Mach-Zehnder modulator that outputs, for example, a 53.125 GBd PAM-4 optical signal. The photodiode 108 is configured to convert a PAM-4 optical signal to a current signal.

The optical transceiver 100 further includes an electrical IC 110 coupled to the optical IC 102. On the transmit side, the electrical IC 110 includes host serializer/deserializer (SERDES) 116 configured to receive NRZ signals from a host 120. An output of the SERDES is supplied to a PAM encoder 114. An output of the PAM encoder 114 is supplied to an electro-optic interferometer driver 112 configured to drive electro-optic modulator 106. The electro-optic interferometer driver 112 may be a Mach-Zehnder Interferometer (MZI) driver in one example. On the receive side, the electrical IC 110 includes a TIA 122, a clock and data recovery (CDR) circuit 124, and a PAM decoder 126. The TIA 122 is a linear TIA configured to convert the current signals received from the photodiode 108 to voltage signals and amplify the voltage signals. In one embodiment, the TIA 122, produced in a CMOS process, may add less than 5% THD (total harmonic distortion) to produce four equally spaced levels in a PAM-4 100 Gbps/λ link. As will be explained further below, the TIA 122 is powered by two different voltage regulators: an on-chip linear regulator 180 and an off-chip switching regulator 190.

In one embodiment, the optical transceiver 100 is a transceiver system-in-package (SiP) including the electrical IC 110 with a monolithically integrated TIA, flip-chipped on the optical IC 102.

Figure 2:
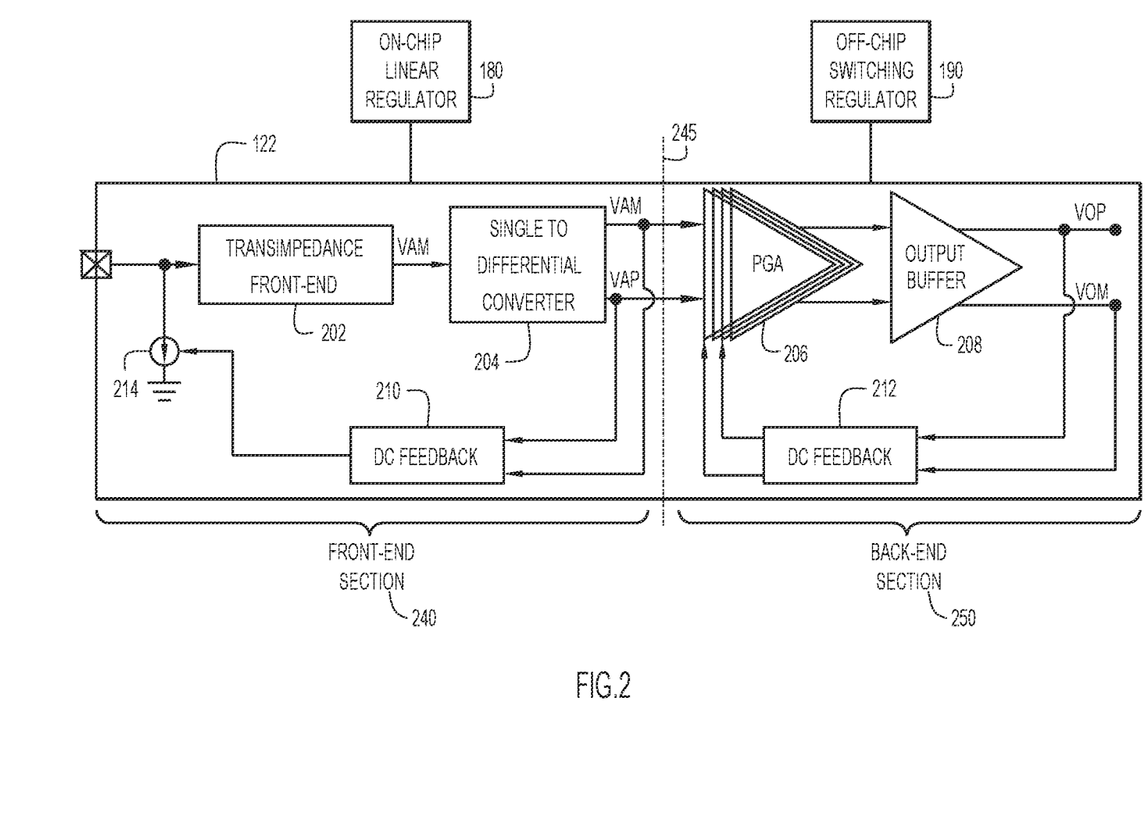
FIG. 2 is a high-level block diagram of the transimpedance amplifier including a demarcation between a front-end section and a back-end section, according to an example embodiment.

FIG. 2 is a high-level block diagram of the transimpedance amplifier 122 including a demarcation between a front-end section and a back-end section, according to an example embodiment. As shown, the TIA 122 includes a transimpedance front-end 202, a single-to-differential converter 204, a programmable gain amplifier (PGA) section 206, and an output buffer section 208. The transimpedance front-end 202 of the TIA 122 may be a current-to-voltage (I/V) converter. The front-end 202 is configured to receive and convert the current output of the photodiode 108 (FIG. 1) to a voltage signal. Because the photodiode current is inherently single ended, the output of the transimpedance front-end 202 is also single ended. Thus, in some embodiments, the single-to-differential converter 204 is employed to receive the voltage signal VAM from the transimpedance front-end 202 and to generate a complementary signal VAP. The PGA section 206 is configured to receive and amplify the complementary voltage signals VAM and VAP. The output buffer section 208 is configured to couple to the PGA section 206 to receive the amplified voltage signals and provide a desired impendence for outputting voltages signals VOP and VOM to an analog-digital converter (ADC) in the CDR 124 (FIG. 1).

In some embodiments, the TIA 122 may further include a first (DC) feedback circuit 210 and a second (DC) feedback circuit 212. The first feedback circuit 210 is coupled between a current source 214 of the TIA 122 and an output of the single-to-differential converter 204. The first feedback circuit 210 is configured to subtract the average value of the photodiode current received from the photodiode 108. The second feedback circuit 212 is coupled between an output of the output buffer section 208 and a first stage of the PGA section 206. The second feedback circuit 212 is configured to minimize the random mismatch effects and prevent saturation of the gain stages in the TIA 122.

As further shown in FIG. 2, TIA 122 may be considered to have a front-end section 240 including, e.g., transimpedance front-end 202, single to differential converter 204 and the first feedback circuit 210, and a back-end section 250 including, e.g., PGA section 206, output buffer section 208 and second feedback circuit 212, with the two sections 240, 250 separated by dashed demarcation line 245. By powering the front-end section 240 and the back-end section 250 with different regulator types, it is possible to save considerable power in the back-end section 250 while still having the benefits of low supply noise in the front-end section 240. In an embodiment, the front-end section 240 is powered by on-chip linear regulator 180, and the back-end section 250 is powered by off-chip switching regulator 190. As used herein, "on-chip" means on the same silicon die as, e.g., transimpedance front-end 202 and single to differential converter 204, and "off-chip" means not on the same die as, e.g., transimpedance front-end 202 and single to differential converter 204, i.e., "off-chip" means a different silicon die.

Figure 3:
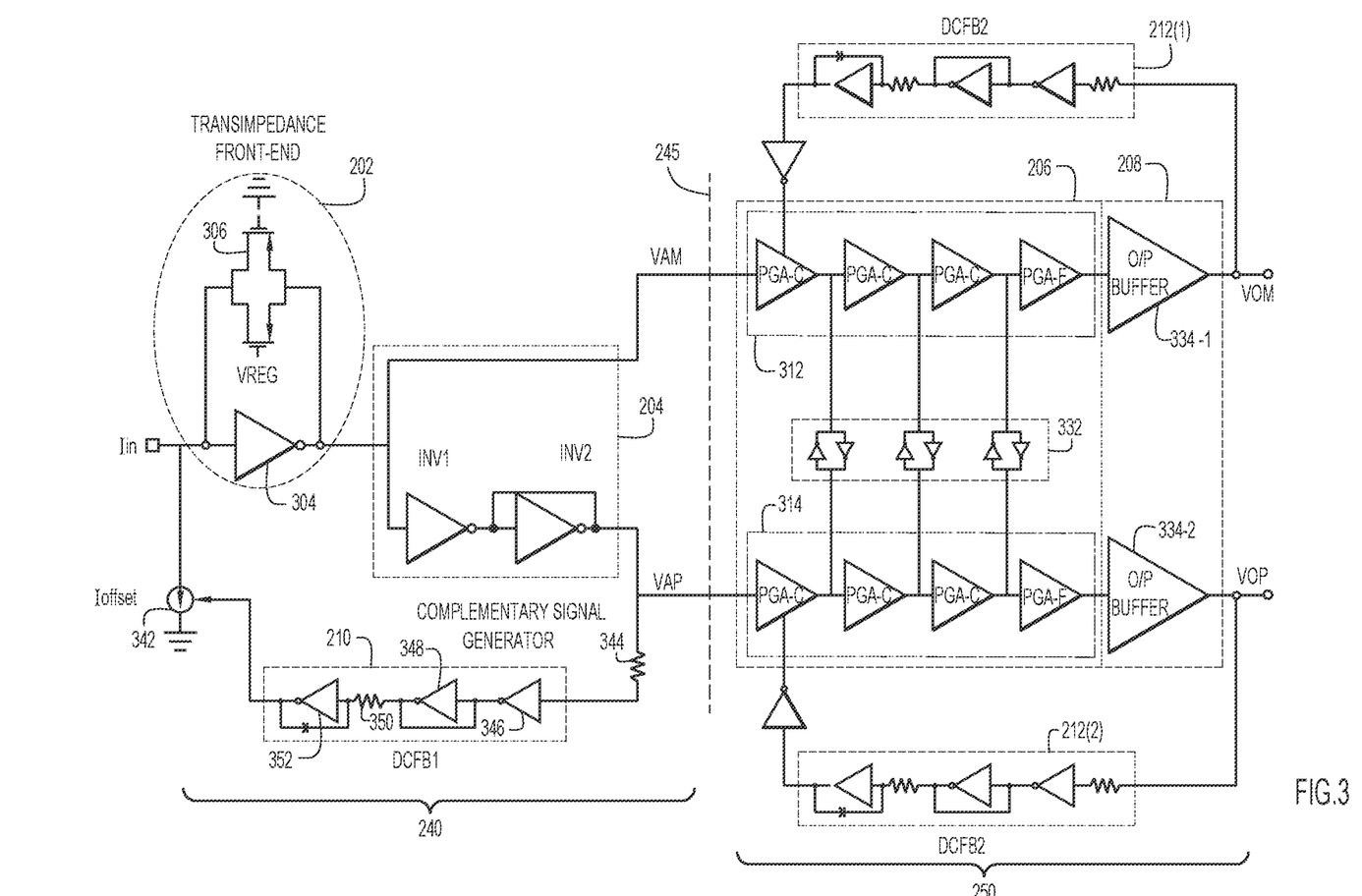
FIG. 3 is a schematic diagram of the transimpedance amplifier including a demarcation between a front-end section and a back-end section, according to an example embodiment.

FIG. 3 is a schematic diagram of the TIA 122 including the demarcation line 245 between the front-end section 240 and the back-end section 250, according to an example embodiment. The transimpedance front-end 202, in one implementation, includes a shunt-feedback inverter 304. The shunt-feedback inverter 304 converts the current output $I_{in}$ of a photodetector, e.g., photodiode 108 in FIG. 1, to a voltage. The resistive component in the feedback loop of the transimpedance front-end 202 may be a MOS device 306 operating in triode region (ohmic mode) to reduce parasitics and achieve a higher bandwidth as compared to a programmable poly-resistor. The MOS device 306 can also save valuable real estate area on a chip. The output of the transimpedance front-end 202 is a voltage signal VAM, which is single-ended voltage signal. As the analog-to-digital converter (ADC) uses a differential (or balanced) input, the single-ended signal may be converted into a differential or balanced form.

The single-ended voltage signal VAM is fed to the single-to-differential converter 204. The single-to-differential converter 204 is a complementary signal generator configured to generate a complementary signal VAP from voltage signal VAM. A single-to-differential converter is perhaps the most challenging block in terms of linearity. Prior art single-to-differential converters typically use a differential pair where the output of the I/V converter is applied to one of the inputs of the differential pair while the other input is connected to an AC ground (a suitable DC voltage). Such a circuit produces a balanced differential output only when the tail current source is ideal (infinite impedance) and when the input is small enough that the differential pair does not fully steer the tail current all to one side or the other. For a realistic range of signals from the I/V converter, the differential output can be highly non-linear. Source degeneration techniques would not work well when the input to the differential pair is single ended. Also, the tail current source is far from ideal. Techniques like simple cascoding or gain-boosted cascoding are effective only at low frequencies. Thus, the current source has a fairly low impedance particularly at high frequencies. This causes the current value to change as a function of the input signal. The effect of having a signal dependent bias current is that the output is non-linear.

To solve these issues, as illustrated in FIG. 3, in one form, the single-to-differential converter 204 includes a first inverter INV1 coupled in series to a second inverter INV2 that has a short-circuit connection from its output to its input. The first inverter INV1 serves as a driver that drives a load of the short-circuited second inverter INV2 to generate the complementary signal VAP. The first inverter INV1 has an input coupled to the transimpedance front-end 202 and an output coupled to an input of the second inverter INV2. The second inverter INV2 has an output coupled to a PGA section 206. The amplitude of the complementary signal VAP is determined by the ratio of the sizes of the driving (INV1) and load (INV2) inverters, and hence can be very tightly controlled. In one embodiment, the sizes of the first inverter INV1 and the second inverter INV2 can be similar or the same. In another embodiment, the size of the load inverter INV2 is smaller than that of the driving inverter INV1 to obtain a gain of unity. The single-to-differential converter 204 is configured to generate a 180 degree out of phase signal VAP from input signal VAM. Any additional phase shift of the complementary path is very small as the pole frequency is near the transit frequency ($f_T$) of the devices. Because the gain of the single-to-differential converter 204 is mostly influenced by a ratio of the transconductances of the driver inverter INV1 and the load inverter INV2, the gain is independent of process and temperature variations. This single-ended to differential arrangement is precise because the amplitude and phase of the signals do not have any resistor dependency, as the single-to-differential converter 204 includes no resistor. However, other forms of single-to-differential converter 204, such as a trans-admittance transimpedance (TAS-TIS) circuit that includes resistor components, may be employed.

The PGA section 206 includes a first signal path 312 and a second signal path 314 that receive the complementary voltage signals VAM and VAP, respectively. Each of the first signal path 312 and the second signal path 314 has a plurality of inverters connected in series without a resistor disposed therebetween. The first signal path 312 is coupled directly after the transimpedance front-end 202, while the second signal path 314 is coupled directly after the single-to-differential converter 204. For example, each of the first signal path 312 and the second signal path 314 may include a cascade of 3 coarse (e.g., 0 or 5 dB) programmable gain stages (PGA-C) and a fine gain stage with, e.g., 0.5 dB steps (PGA-F). However, the number of connected PGAs are not so limited and other numbers of PGA-C and PGA-F may be employed.

Still with reference to FIG. 3, the first signal path 312 and the second signal path 314 are cross-coupled to each other through a plurality of inverters 332. These inverters 332 between the complementary signal paths 312 and 314 minimize any amplitude and phase mismatch that is applied at the input of the complementary signal paths 312 and 314.

The output buffer section 208 is coupled after the PGA section 206. Specifically, the first signal path 312 and the second signal path 314 are coupled to output buffers 334-1 and 334-2, respectively. In some embodiments, the output buffer topology can be used as a voltage mode driver, offering a controlled output impedance like 50Ω and having good bandwidth and linearity in serial transceiver blocks (SERDES). The function of the output buffers 334-1 and 334-2 is to provide a large linear output swing and have a well-controlled output impedance.

As illustrated in FIG. 3, the entire signal path from the transimpedance front-end 202 to the output buffer section 208 is composed of DC-coupled inverters operating in the linear region. Using multiples of unit-sized inverters may eliminate systematic offset. In some embodiments, every section starting from the UV converter to the output buffer section 208 is built using a basic CMOS inverter. Each section may use any number of basic CMOS inverter(s) such that, in each section, only the number of the inverters may vary. For example, in the single-to-differential converter 204, the driver INV1 may have 9 units of basic inverters connected in parallel and load INV2 may have 8 units in parallel.

In some embodiments, the TIA 122 further includes a first feedback circuit (DCFB1) 210 coupled between a current source 342 and the output of the second inverter INV2 of the single-to-differential converter 204. The first feedback circuit 210 includes a first resistor 344, a first invertor 346, a first short-circuited inverter 348, a second resistor 350, and a final invertor 352 with capacitive feedback, all connected in series. The first feedback circuit 210 is configured to subtract the average value of the photodiode current at the input. The TIA 122 further includes two second feedback circuits (DCFB2) 212(1) and 212(2), one on each of the first signal path 312 and the second signal path 314. Each of the second feedback circuits 212(1) and 212(2) is coupled between an output of the output buffer 334-1 or 334-2 and a first stage of the PGA section 206, i.e., the first coarse PGA (PGA-C) in the signal path. The components of the second feedback circuits 212(1) and 212(2) are similar to those of the first feedback circuit 210 and are therefore not described. The second feedback circuits 212(1) and 212(2) are configured to minimize the random mismatch effects and prevent saturation of the gain stages. The DC feedback loops also use unit-sized inverters and provide a high-pass corner frequency of less than 100 kHz for the signal. Automatic gain control (AGC) provided to the TIA 122 is implemented via firmware by monitoring the A/D converter (ADC) output in the clock and data recovery (CDR) block 124 (FIG. 1).

Those skilled in the art will appreciate that the several components described in FIG. 3 and indicated as being part of the front-end section 240 are powered by on-chip linear regulator 180, and the several components described in FIG. 3 and indicated as being part of the back-end section 250 are powered by off-chip switching regulator 190.

Figure 4:
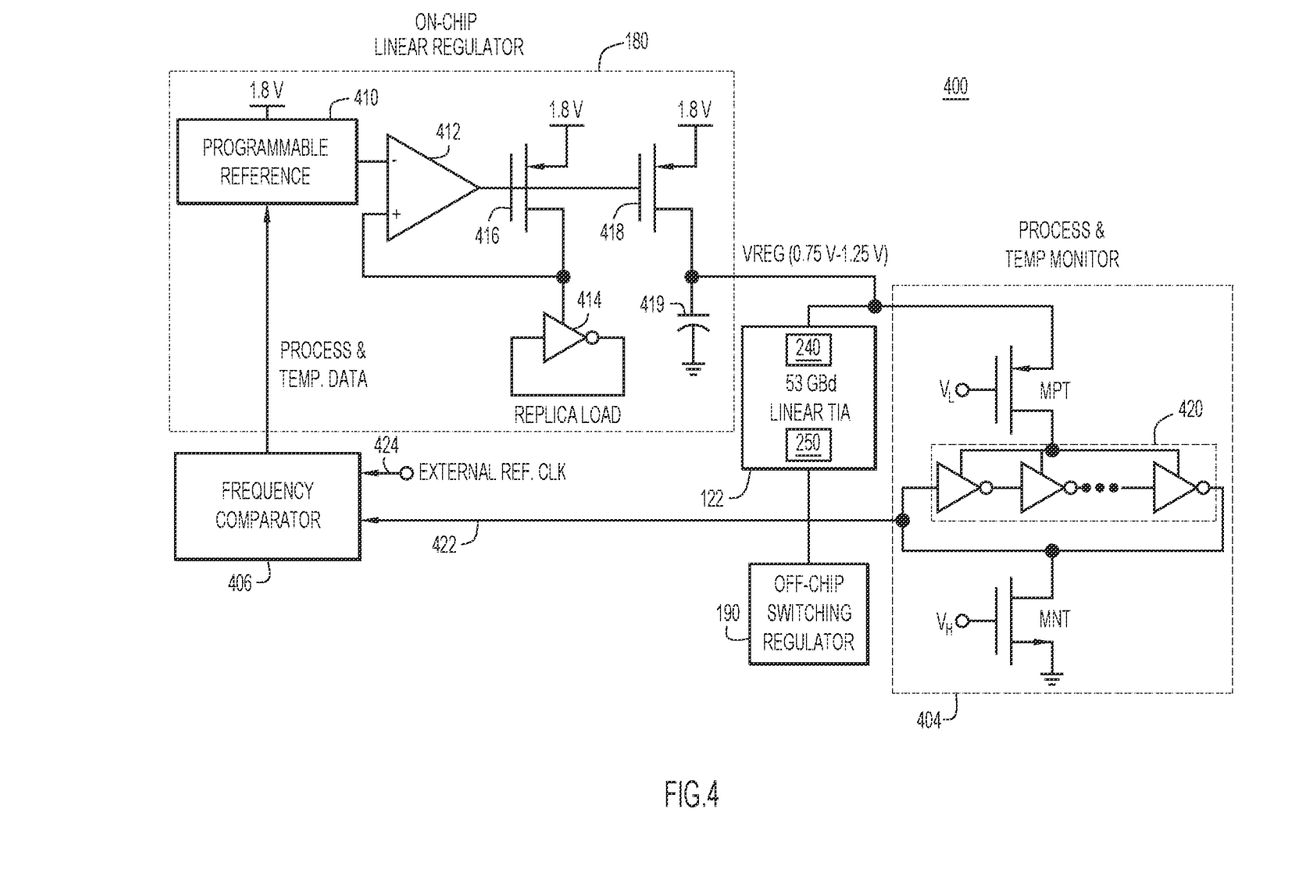
FIG. 4 is a schematic diagram depicting an implementation of an on-chip linear regulator to achieve dynamic voltage scaling for a front-end section of the transimpedance amplifier along with an off-chip switching regulator to power a back-end section of the transimpedance amplifier, according to an example embodiment.

FIG. 4 is a schematic diagram depicting an implementation of an on-chip linear regulator 180 to provide power supply noise rejection and achieve dynamic voltage scaling for the front-end section 240 of the transimpedance amplifier 122 along with an off-chip switching regulator 190 to power the back-end section 250 of the transimpedance amplifier 122, according to an example embodiment. As shown, a circuit 400 includes the TIA 122, a (programmable) on-chip linear regulator 180, a process and temperature monitor 404, and a frequency comparator 406. The on-chip linear regulator 180 is configured to provide suitable power to the front-end section 240 of TIA 122 and to the process and temperature monitor 404. The on-chip linear regulator 180 includes a programmable reference 410, an operational amplifier 412, a replica load 414, two transistors 416 and 418, and a capacitor 419, to regulate output voltage VREG to between 0.75 V and 1.25 V. The programmable reference 410 outputs a control signal to the operational amplifier 412 based on process and temperature data received from the frequency comparator 406. The operational amplifier 412 compares the control signal from the programmable reference 410 with a signal from the replica load 414 and outputs a regulating signal to the transistors 416 and 418 to regulate the voltage suppled to the front-end section 240 of the TIA 122. The capacitor 419 is disposed between the regulated output and ground and further improves immunity to the substrate noise.

The regulated voltage adapts to process and temperature variations, thus tightly controlling the bandwidth and peaking of the TIA 122. The on-chip linear regulator 180 uses the process and temperature data to regulate the voltage. The process and temperature data is indicative of the process and temperature variations that affects the TIA 122. The process and temperature monitor 404 is configured to monitor the process and temperature variations. The process and temperature monitor 404 includes a ring oscillator (RO) 420 and two transistors MPT and MNT to protect the RO 420 from over-voltage.

The range of the regulated voltage is, for example, from 0.75 to 1.25 V across the process, voltage, and temperature (PVT) variations. In this example, the voltage across any two terminals of a transistor may not exceed 0.9 V. The RO 420 made of the same unit-sized inverter as those in the TIA 122 serves as a PVT variations sensor. The RO 420 is used as a process and temperature sensor and has the delay stages built with a number (e.g., 2) of unit inverters. Thus, there is a high degree of correlation between the elements in the TIA 122 and the RO 420. Hence the regulated supply voltage can be adjusted precisely to within a few millivolts to obtain optimum gain and bandwidth across all process and temperature ranges. Although voltage swing in the TIA 122 is well below rail-to-rail, a ring oscillator swings from rail-to-rail. Thus, the MOS devices in triode region, MPT and MNT, are added to prevent over-voltage. The frequency 422 of the RO 420, which is influenced by process and temperature variations, is compared with an external reference clock 424 at the frequency comparator 406. A digital output of the frequency comparator 406 thus represents the process-corner and temperature of the TIA 122. The on-chip linear regulator 180 is programmed via a firmware feedback loop to get a targeted RO frequency. An example control algorithm for regulating voltage output to the TIA 122 is shown below:

VTT=0.91V on reset;

Target output of the frequency comparator is 1F1(h) (programmable);

Regulator input is increased/decreased by 1 LSB (8 mV) depending on the output of the frequency comparator;

Repeat the above steps till the output is within a target count (1F1±3) of the desired value (software programmable);

The resolution/range of the comparator can be programmed (desired counter value scales from 1F1 appropriately).

The regulated supply voltage VREG is automatically adjusted for different process corners and temperatures to maximize the bandwidth and minimize any in-band peaking for the TIA 122. In one embodiment, all the transistors in the inverter stages are biased in the saturation region and circuit 400 adjusts their bias point to compensate for variations in mobility and threshold voltage. Thus, with the circuit 400, the transconductance of all the devices in the TIA 122 are tightly controlled across process, voltage and temperature (PVT) variations. Similarly, the output conductance of the triode devices in the feedback path of the front-end section 240 (FIG. 3) is also tightly bound with similar scheme.

As the TIA performance cannot be fully ascertained at the wafer stage, without the process and temperature tuning, there could be a significant loss of module yield. Discarding assembled modules for any performance shortcoming is very costly. The tuning scheme can also be used to fine tune the quality of the received data eye. According to the techniques disclosed above, the parametric yield of the TIA is expected to be very high as process and temperature variations are automatically compensated to maintain the key performance parameters in a very tight bound.

As noted above, TIA 122 can consume a considerable amount of power. For example, a single TIA 122, on a die, driven by a 1.8 V supply, might draw on the order of 40 mA, thus consuming 72 mW. And, a single die might host eight TIAs, for a total power consumption on the order of 576 mW. By supplying power to the front-end section 240 of the TIA 122 with the on-chip linear regulator 180, and supplying power to the back-end section 250 of the TIA 122 with a more efficient off-chip switching regulator 190, power savings can be achieved.

Off-chip switching regulator 190 may be configured in accordance with any known circuit topology. Switching regulators are inherently more power efficient than linear ones. However, they are more noisy than linear ones. As the back-end section 250 of the TIA 122 is fully differential any power supply noise will appear as a common-mode signal and does not affect the differential output of the TIA 122.

Figure 5:
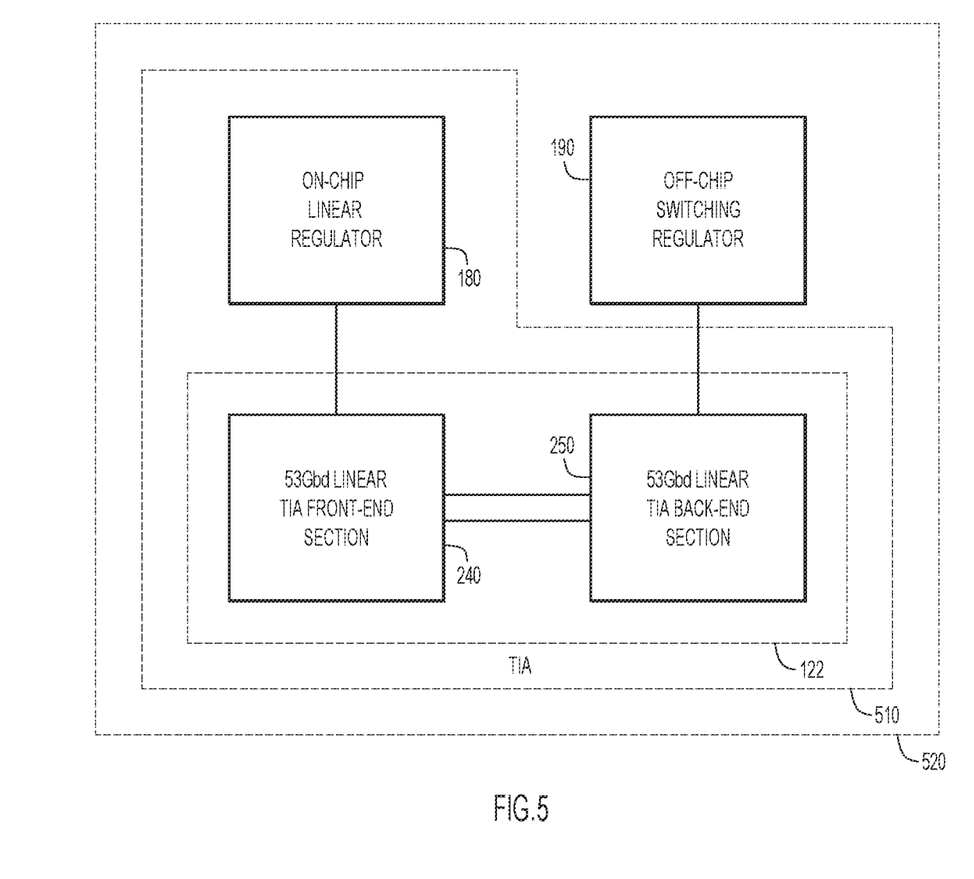
FIG. 5 is a high-level block diagram illustrating front and back-end sections of a transimpedance amplifier being powered by an on-chip linear regulator and an off-chip switching regulator, respectively, according to an example embodiment.

FIG. 5 is a high-level block diagram illustrating front-end section 240 and back-end section 250 of TIA 122 being powered by on-chip linear regulator 180 and off-chip switching regulator 190, respectively, according to an example embodiment. In an embodiment, TIA 122 and on-chip linear regulator 180 are disposed on the same chip 510 (i.e., die), and chip 510 and off-chip switching regulator 190 (e.g., a separate IC) might be on a same circuit board 520.

In an example implementation, the front-end section 240 draws 15 mA from a 1.8V supply for power consumption of 27 mW. The back-end section 250 might draw 25 mA from off-chip switching regulator 190 (regulated at 1V), for a total of 28 mW assuming a regulator efficiency of 90%. For eight TIAs on a single die, the total power consumed is 440 mW. If the entire TIA were to be powered by the linear regulator, the power dissipation would be (15 mA+25 mA)*1.8*8=576 mW. Thus, the dual regulator scheme would save 176 mW or nearly 24% power. In order to ensure the proper performance of the TIA 122, however, the regulators 180, 190, should be properly tuned or synchronized to one another so as to avoid unintended distortion, bias, or even saturation, especially in the context of PAM-4 techniques.

Figure 6:
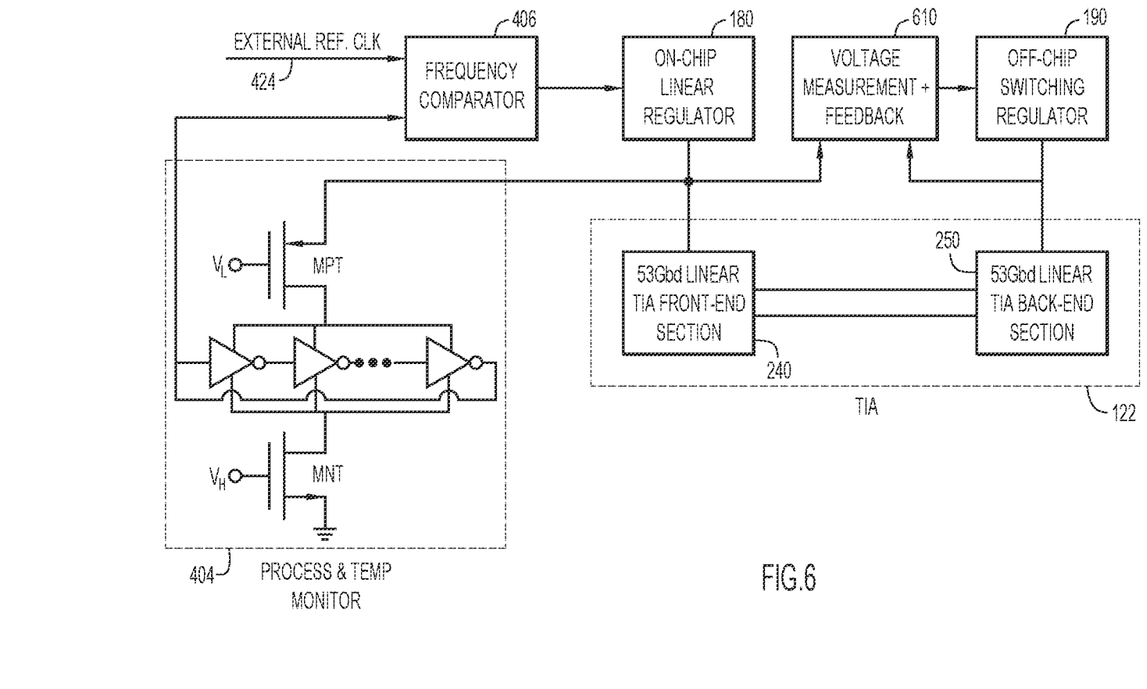
FIG. 6 is a high-level block diagram depicting a voltage measurement and feedback block used to control a voltage of the off-chip regulator, according to an example embodiment.

FIG. 6 is a high-level block diagram depicting a voltage measurement and feedback block 610 used to set a voltage of the off-chip switching regulator 190, according to an example embodiment. As shown, FIG. 6 is similar to FIG. 5, but also includes on-chip process and temperature monitor 404, frequency comparator 406, external reference clock 424, and voltage measurement and feedback block 610. As explained previously, the process and temperature monitor 404 is configured to monitor the process and temperature variations, and to provide feedback to control the on-chip linear regulator 180 output voltage, which is sensed by the process and temperature monitor 404. The voltage measurement and feedback block 610 also monitors the output of the on-chip linear regulator 180, and further monitors the output voltage of the off-chip switching regulator 190, and then forces the output of the off-chip switching regulator 190 to be the same as the output voltage of the on-chip linear regulator 180. In this way, the outputs of the two supplies are tuned or synchronized together, thus avoiding a supply mismatch between the front-end section 240 and the back-end section 250.

Figure 7:
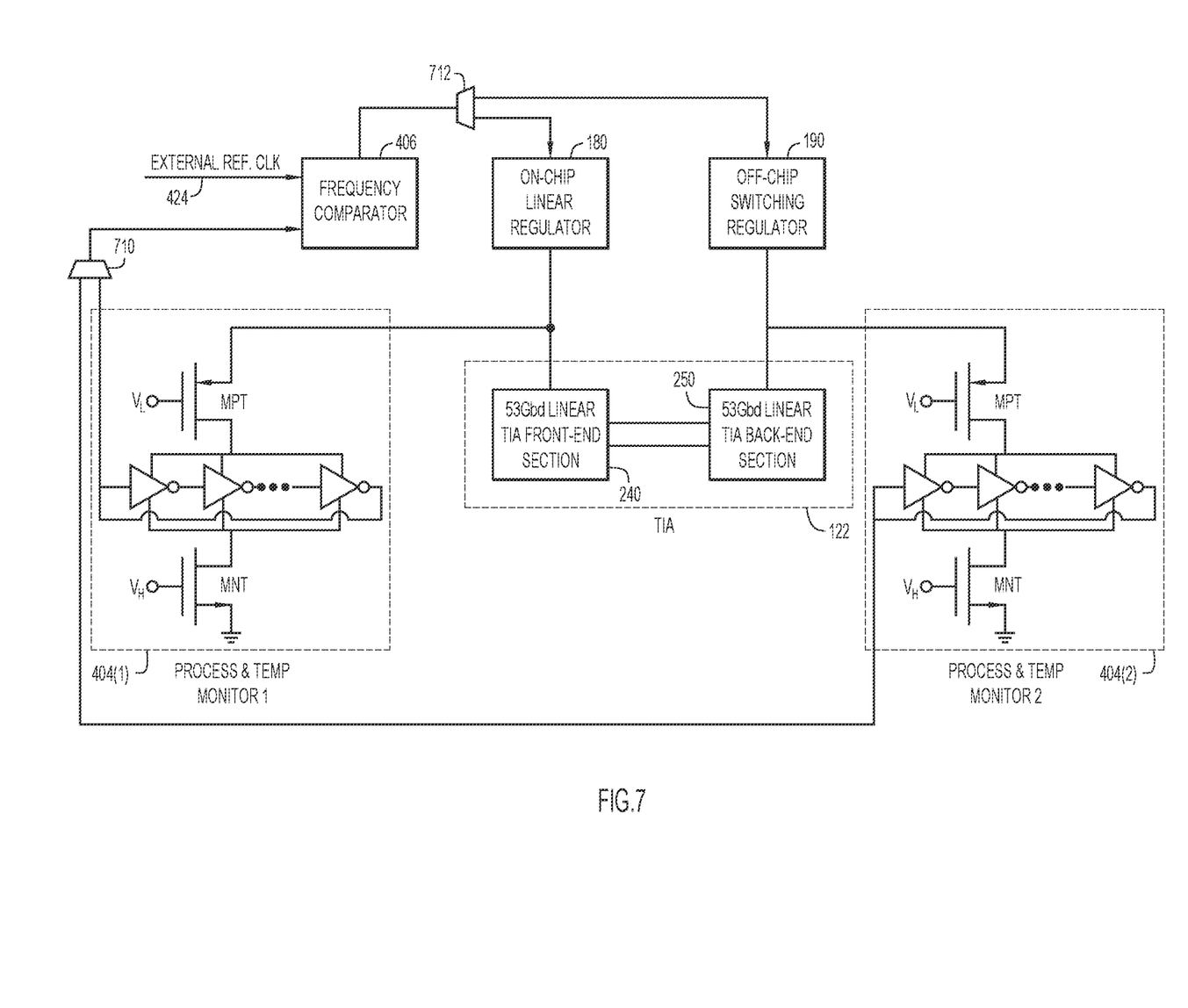
FIG. 7 is a high-level block diagram illustrating the use of respective process and temperature monitors that are used to provide control feedback for the on-chip linear regulator and the off-chip switching regulator, according to an example embodiment.

FIG. 7 is a high-level block diagram illustrating the use of respective process and temperature monitors 404(1) and 404(2) that are used to provide control feedback for the on-chip linear regulator 180 and the off-chip switching regulator 190, respectively, according to an example embodiment. As shown, the first process and temperature monitor 404(1) is used to monitor the output of the on-chip linear regulator 180 and the second process and temperature monitor 404(2) is used to monitor the output of the off-chip switching regulator. The outputs of the process and temperature monitors 404(1) and 404(2) are fed back through a multiplexer or switch 710 to frequency comparator 406. The switch 710 selects one of the outputs at a time to be compared to the external reference clock 424. An output of the frequency comparator 406 is then passed through a demultiplexer or switch 712 to provide a control signal to the appropriate supply, i.e., on-chip linear regulator 180 or off-chip switching regulator 190 to tune, or synchronize, the output voltages of the two regulators 180, 190. Switch 712 could be replaced with a firmware loop. The tuning approach depicted in FIG. 7 may, however, suffer from a mismatch between the first process and temperature monitor 404(1) and the second process and temperature monitor 404(2). Such a mismatch may be addressed by the embodiment shown in FIG. 8.

Figure 8:
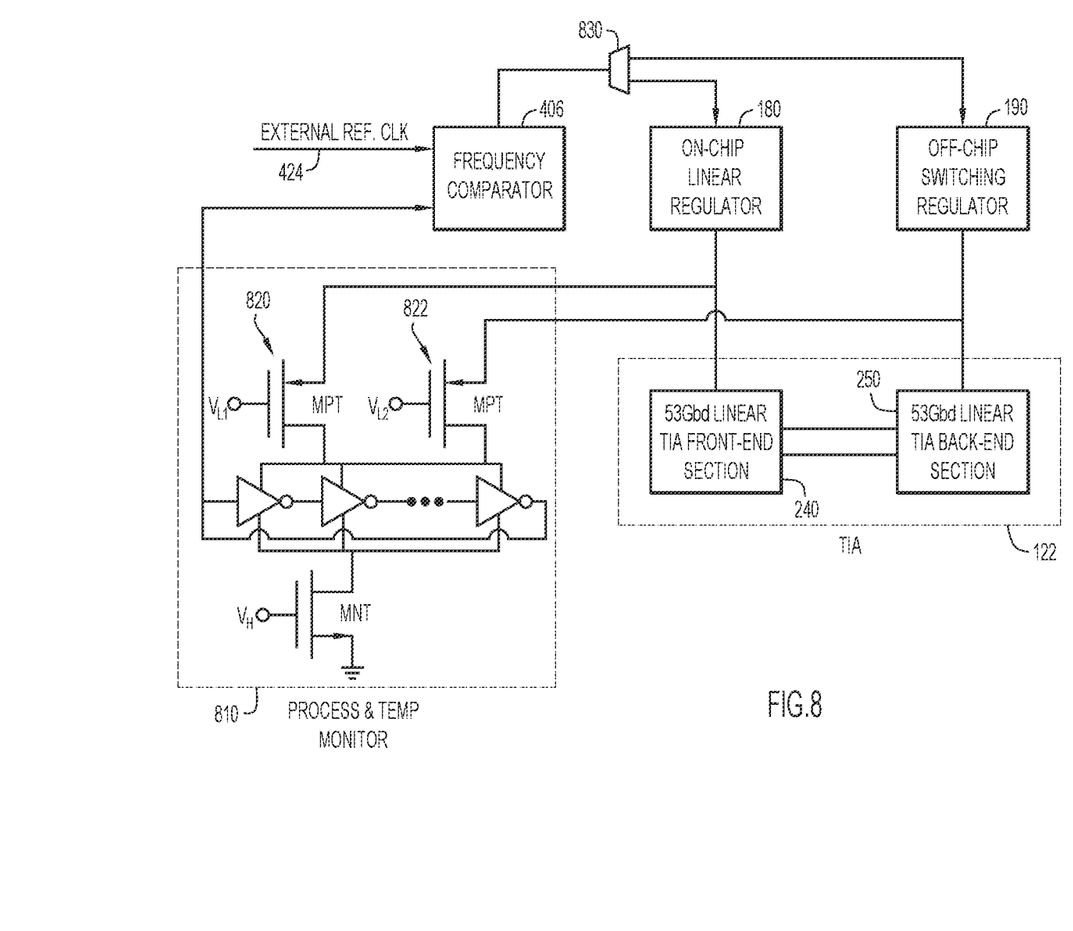
FIG. 8 is high level block diagram illustrating the use of a single process and temperature monitor that is used to provide control feedback for the on-chip linear regulator and the off-chip switching regulator, according to an example embodiment.

FIG. 8 is high level block diagram illustrating the use of a single process and temperature monitor 810 that is used to provide control feedback for the on-chip linear regulator 180 and the off-chip switching regulator 190, according to an example embodiment. More specifically, instead of deploying two separate process and temperature monitors, as shown in FIG. 7, to separately feed frequency comparator 406, in the embodiment of FIG. 8 the single process and temperature monitor 810 is used to monitor the outputs of each of the on-chip linear regulator 180 and the off-chip switching regulator 190 individually by selectively turning on switches MPT1 820 or MPT2 822. In this way the same process and temperature monitor 810 is used to monitor the output voltages. The frequency comparator 406 is switched through demultiplexer or switch 830 to provide the appropriate control feedback to each of the on-chip linear regulator 180 and the off-chip switching regulator 190. Switch 830 could be replaced with a firmware loop. The output voltages of on-chip linear regulator 180 and the off-chip switching regulator 190 are accordingly tuned, or synchronized, with each other.

The embodiment of FIG. 8 provides the low noise benefits of the on-chip linear regulator 180, the power efficiency of the off-chip switching regulator 190, and the accuracy of a common process and temperature monitor 810 for both regulators.

Figure 9:
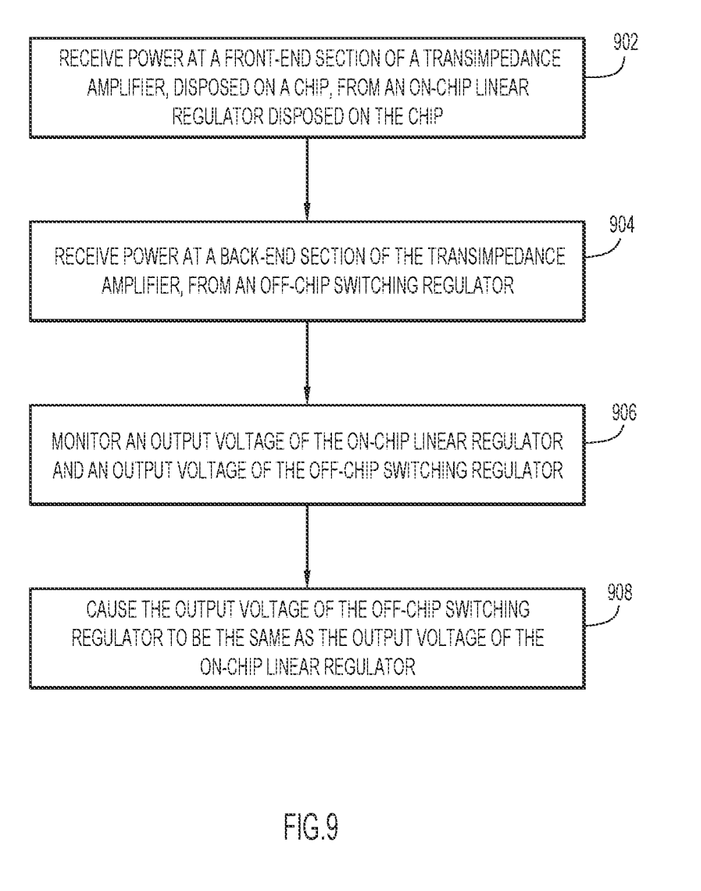
FIG. 9 is a flow chart depicting a series of operations for operating a transimpedance amplifier system, according to an example embodiment.

FIG. 9 is a flow chart depicting a series of operations for operating a transimpedance amplifier system, according to an example embodiment. At 902, the system receives power at a front-end section of the transimpedance amplifier, disposed on a chip, from an on-chip linear regulator disposed on the chip. At 904, the system receives power at a back-end section of the transimpedance amplifier, from an off-chip switching regulator. At 906, the system monitors an output voltage of the on-chip linear regulator and an output voltage of the off-chip switching regulator. At 908, the system causes the output voltage of the off-chip switching regulator to be the same as the output voltage of the on-chip linear regulator.

In summary, in one aspect, a system is provided. The system includes a transimpedance amplifier disposed on a chip and having a front-end section and a back-end section; an on-chip linear regulator, on the chip, arranged to power the front-end section; and an off-chip switching regulator, off the chip, arranged to power the back-end section.

The front-end section may include transimpedance front-end, a single to differential converter and a first feedback circuit.

The back-end section may include a programmable gain amplifier section, an output buffer, and a second feedback circuit.

The system may further include a voltage measurement and feedback block, in communication with the off-chip switching regulator, that is configured to monitor an output voltage of the on-chip linear regulator, monitor an output voltage of the off-chip switching regulator, and cause the output voltage of the off-chip switching regulator to be tuned to the output voltage of the on-chip linear regulator.

The system may further include a process and temperature monitor circuit arranged to monitor an output of the on-chip linear regulator.

The system may include a first process and temperature monitor circuit arranged to monitor an output of the on-chip linear regulator, and a second process and temperature monitor circuit arranged to monitor an output of the off-chip switching regulator.

The system may further include a frequency comparator and a multiplexer in communication with the frequency comparator, wherein an output of the first process and temperature monitor circuit and an output of the second process and temperature monitor circuit are selectively supplied to the frequency comparator via the multiplexer.

In an embodiment, the frequency comparator is in communication with the on-chip linear regulator and the off-chip switching regulator via a demultiplexer, and an output of the frequency comparator is selectively supplied to the on-chip linear regulator and the off-chip switching regulator via to demultiplexer.

The system may include a process and temperature monitor circuit configured to independently monitor an output of the on-chip linear regulator and the off-chip switching regulator.

In an embodiment, the process and temperature monitor circuit may include a first switch in communication with the output of the on-chip linear regulator, and a second switch in communication with the output of the off-chip switching regulator.

The system may include a frequency comparator, wherein an output of the process and temperature monitor circuit is supplied to the frequency comparator.

In an embodiment, the frequency comparator is in communication with the on-chip linear regulator and the off-chip switching regulator via a demultiplexer, and an output of the frequency comparator is selectively supplied to the on-chip linear regulator and the off-chip switching regulator via a demultiplexer.

In another embodiment, a device is provided and includes a transimpedance amplifier disposed on a chip and having a front-end section and a back-end section; an on-chip linear regulator, on the chip, arranged to power the front-end section; and a process and temperature monitor circuit configured to independently monitor an output of the on-chip linear regulator and an off-chip switching regulator that powers the back-end section.

In the device, the process and temperature monitor circuit may include a first switch in communication with the output of the on-chip linear regulator, and a second switch in communication with the output of the off-chip switching regulator.

The device may also include a frequency comparator, and wherein an output of the process and temperature monitor circuit is supplied to the frequency comparator.

In the device the frequency comparator may be in communication with the on-chip linear regulator and the off-chip switching regulator via a demultiplexer, and an output of the frequency comparator is selectively supplied to the on-chip linear regulator and the off-chip switching regulator via the demultiplexer.

In still another embodiment, a method includes receiving power at a front-end section of a transimpedance amplifier, disposed on a chip, from an on-chip linear regulator disposed on the chip; receiving power at a back-end section of the transimpedance amplifier, from an off-chip switching regulator; monitoring an output voltage of the on-chip linear regulator and an output voltage of the off-chip switching regulator; and causing the output voltage of the off-chip switching regulator to be the same as, or identical to, the output voltage of the on-chip linear regulator.

In the method, the front-end section may include a transimpedance front-end, a single to differential converter and a first feedback circuit.

In the method, the back-end section may include a programmable gain amplifier section, an output buffer, and a second feedback circuit.

The method may further include monitoring the output voltage of the on-chip linear regulator and the output voltage of the off-chip switching regulator using a single process and temperature monitoring circuit.

The above description is intended by way of example only. Various modifications and structural changes may be made therein without departing from the scope of the concepts described herein and within the scope and range of equivalents of the claims.

What is claimed is:

1. A system, comprising:
a transimpedance amplifier disposed on a chip, the transimpedance amplifier having a front-end section and a back-end section;
an on-chip linear regulator, on the chip, arranged to power the front-end section; and
an off-chip switching regulator, off the chip, arranged to power the back-end section.

2. The system of claim 1, wherein the front-end section comprises a transimpedance front-end, a single to differential converter and a first feedback circuit.

3. The system of claim 1, wherein the back-end section comprises a programmable gain amplifier section, an output buffer, and a second feedback circuit.

4. The system of claim 1, further comprising a voltage measurement and feedback block, in communication with the off-chip switching regulator, that is configured to monitor an output voltage of the on-chip linear regulator, monitor an output voltage of the off-chip switching regulator, and cause the output voltage of the off-chip switching regulator to be tuned to the output voltage of the on-chip linear regulator.

5. The system of claim 4, further comprising a process and temperature monitor circuit arranged to monitor an output of the on-chip linear regulator.

6. The system of claim 1, further comprising a first process and temperature monitor circuit arranged to monitor an output of the on-chip linear regulator, and a second process and temperature monitor circuit arranged to monitor an output voltage of the off-chip switching regulator.

7. The system of claim 6, further comprising a frequency comparator and a multiplexer in communication with the frequency comparator, and wherein an output of the first process and temperature monitor circuit and an output of the second process and temperature monitor circuit are selectively supplied to the frequency comparator via the multiplexer.

8. The system of claim 7, wherein the frequency comparator is in communication with the on-chip linear regulator and the off-chip switching regulator via a demultiplexer, and an output of the frequency comparator is selectively supplied to the on-chip linear regulator and the off-chip switching regulator via the demultiplexer.

9. The system of claim 1, further comprising a process and temperature monitor circuit configured to independently monitor an output of the on-chip linear regulator and the off-chip switching regulator.

10. The system of claim 9, wherein the process and temperature monitor circuit comprises a first switch in communication with the output of the on-chip linear regulator, and a second switch in communication with the output of the off-chip switching regulator.

11. The system of claim 9, further comprising a frequency comparator, and wherein an output of the process and temperature monitor circuit is supplied to the frequency comparator.

12. The system of claim 11, wherein the frequency comparator is in communication with the on-chip linear regulator and the off-chip switching regulator via a demultiplexer, and an output of the frequency comparator is selectively supplied to the on-chip linear regulator and the off-chip switching regulator via a second demultiplexer.

13. A device comprising:
a transimpedance amplifier disposed on a chip, the transimpedance amplifier having a front-end section and a back-end section;
an on-chip linear regulator, on the chip, arranged to power the front-end section; and
a process and temperature monitor circuit configured to independently monitor an output of the on-chip linear regulator and an off-chip switching regulator that powers the back-end section.

14. The device of claim 13, wherein the process and temperature monitor circuit comprises a first switch in communication with the output of the on-chip linear regulator, and a second switch in communication with the output of the off-chip switching regulator.

15. The device of claim 13, further comprising a frequency comparator, and wherein an output of the process and temperature monitor circuit is supplied to the frequency comparator.

16. The device of claim 15, wherein the frequency comparator is in communication with the on-chip linear regulator and the off-chip switching regulator via a demultiplexer, and an output of the frequency comparator is selectively supplied to the on-chip linear regulator and the off-chip switching regulator via the demultiplexer.

17. A method comprising:
- receiving power at a front-end section of a transimpedance amplifier, disposed on a chip, from an on-chip linear regulator disposed on the chip;
- receiving power at a back-end section of the transimpedance amplifier, from an off-chip switching regulator;
- monitoring an output voltage of the on-chip linear regulator and an output voltage of the off-chip switching regulator; and
- causing the output voltage of the off-chip switching regulator to be identical to the output voltage of the on-chip linear regulator.

18. The method of claim 17, wherein the front-end section comprises a transimpedance front-end, a single to differential converter and a first feedback circuit.

19. The method of claim 17, wherein the back-end section comprises a programmable gain amplifier section, an output buffer, and a second feedback circuit.

20. The method of claim 17, further comprising monitoring the output voltage of the on-chip linear regulator and the output voltage of the off-chip switching regulator using a single process and temperature monitoring circuit.

* * * * *